US008524319B2

(12) United States Patent
Kimbel et al.

(10) Patent No.: US 8,524,319 B2
(45) Date of Patent: Sep. 3, 2013

(54) METHODS FOR PRODUCING CRUCIBLES WITH A REDUCED AMOUNT OF BUBBLES

(75) Inventors: Steven L. Kimbel, St. Charles, MO (US); Harold W. Korb, Chesterfield, MO (US); Richard J. Phillips, St. Peters, MO (US); Shailendra B. Rathod, St. Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 13/299,922

(22) Filed: Nov. 18, 2011

(65) Prior Publication Data

US 2013/0129921 A1 May 23, 2013

(51) Int. Cl.
*B05D 7/22* (2006.01)

(52) U.S. Cl.
CPC .................................. *B05D 7/22* (2013.01)
USPC ................. 427/237; 427/255.11; 427/255.37; 427/255.393

(58) Field of Classification Search
CPC ........................................................ B05D 7/22
USPC ......... 427/230, 237, 255.11, 255.15, 255.18, 427/255.37, 255.393
See application file for complete search history.

(56) References Cited

U.S. PATENT DOCUMENTS

| 2,669,762 | A | | 2/1954 | Blackburn et al. |
| 3,215,517 | A | | 11/1965 | Zimmermann |
| 3,431,332 | A | | 3/1969 | Cummings |
| 3,522,028 | A | | 7/1970 | Goto |
| 3,533,897 | A | | 10/1970 | Robbins, Jr. et al. |
| 3,717,450 | A | | 2/1973 | Loughridge et al. |
| 3,837,825 | A | | 9/1974 | Loxley et al. |
| 4,019,645 | A | | 4/1977 | Seiler et al. |
| 4,072,489 | A | | 2/1978 | Loxley et al. |
| 4,416,680 | A | | 11/1983 | Bruning et al. |
| 4,612,023 | A | | 9/1986 | Kreutzer et al. |
| 4,632,686 | A | * | 12/1986 | Brown et al. ................ 65/17.3 |
| 4,812,278 | A | | 3/1989 | Natori et al. |
| 4,842,628 | A | | 6/1989 | Kreutzer et al. |
| 4,963,178 | A | | 10/1990 | Brown et al. |
| 5,096,479 | A | | 3/1992 | Allen et al. |
| 5,149,474 | A | | 9/1992 | Rohatyn |
| 5,762,672 | A | | 6/1998 | Ikeda et al. |
| 5,913,975 | A | | 6/1999 | Holder |
| 5,977,000 | A | | 11/1999 | Sato et al. |
| 6,381,986 | B1 | | 5/2002 | Loxley et al. |
| 6,555,048 | B1 | | 4/2003 | Yoon et al. |
| 6,776,006 | B2 | | 8/2004 | Best et al. |
| 7,053,017 | B2 | | 5/2006 | Hrdina et al. |
| 7,111,476 | B2 | | 9/2006 | Loxley et al. |
| 7,383,696 | B2 | * | 6/2008 | Kemmochi et al. ............ 65/60.1 |
| 7,587,912 | B2 | | 9/2009 | Ohama et al. |
| 7,841,212 | B2 | | 11/2010 | Wang et al. |
| 7,909,931 | B2 | * | 3/2011 | Saito et al. ..................... 117/200 |
| 8,104,309 | B2 | | 1/2012 | Borens et al. |
| 8,272,234 | B2 | * | 9/2012 | Kemmochi et al. ............ 65/17.3 |
| 2002/0043080 | A1 | | 4/2002 | Best et al. |
| 2003/0094131 | A1 | | 5/2003 | Tsujimoto et al. |
| 2005/0120945 | A1 | * | 6/2005 | Hansen ............................ 117/15 |
| 2006/0281623 | A1 | | 12/2006 | Winnen et al. |
| 2007/0082149 | A1 | | 4/2007 | Linnot et al. |
| 2007/0102133 | A1 | | 5/2007 | Kemmochi et al. |
| 2008/0092804 | A1 | | 4/2008 | Hansen et al. |
| 2008/0153688 | A1 | | 6/2008 | Borens et al. |
| 2009/0095022 | A1 | | 4/2009 | Burdette et al. |
| 2010/0000465 | A1 | * | 1/2010 | Kishi et al. ..................... 117/208 |
| 2011/0315071 | A1 | * | 12/2011 | Sudo et al. ....................... 117/13 |
| 2011/0315072 | A1 | * | 12/2011 | Sudo et al. ....................... 117/19 |

FOREIGN PATENT DOCUMENTS

| EP | 2143692 A1 | 1/2010 |
| EP | 2168925 A2 | 3/2010 |
| JP | 2196083 A | 8/1990 |
| JP | 2005206446 A | 8/2005 |
| WO | WO 2011/009062 A2 * | 1/2011 |

OTHER PUBLICATIONS

Co-Owned U.S. Appl. 13/299,917, filed Nov. 18, 2011.
Co-Owned U.S. Appl. 13/299,929, filed Nov. 18, 2011.
Co-Owned U.S. Appl. No. 13/299,926, filed Nov. 18, 2011.
Fused Quartz Properties & Usage Guide, May 18, 2007, pp. 1-5, Momentive Performance Materials Quartz, Inc., http://www.quartz.com/gedata.html.
PCT International Search Report and Written Opinion of the International Searching Authority mailed on Mar. 26, 2013 regarding PCT/US2012/065208 filed on Nov. 15, 2012.
Office Action dated Dec. 19, 2012 in Co-Owned U.S. Appl. No. 13/299,926.
PCT Invitation to Pay Additional Fees and, Where Applicable, Protest Fee of the International Searching Authority mailed on Feb. 5, 2013 regarding PCT/US2012/065208.

* cited by examiner

*Primary Examiner* — William Phillip Fletcher, III
(74) *Attorney, Agent, or Firm* — Armstrong Teasdale LLP

(57) ABSTRACT

Methods for producing crucibles for holding molten material that contain a reduced amount of gas pockets are disclosed. The methods may involve use of molten silica that may be outgassed prior to or during formation of the crucible. Crucibles produced from such methods and ingots and wafers that are produced from crucibles with a reduced amount of gas pockets are also disclosed.

20 Claims, 1 Drawing Sheet

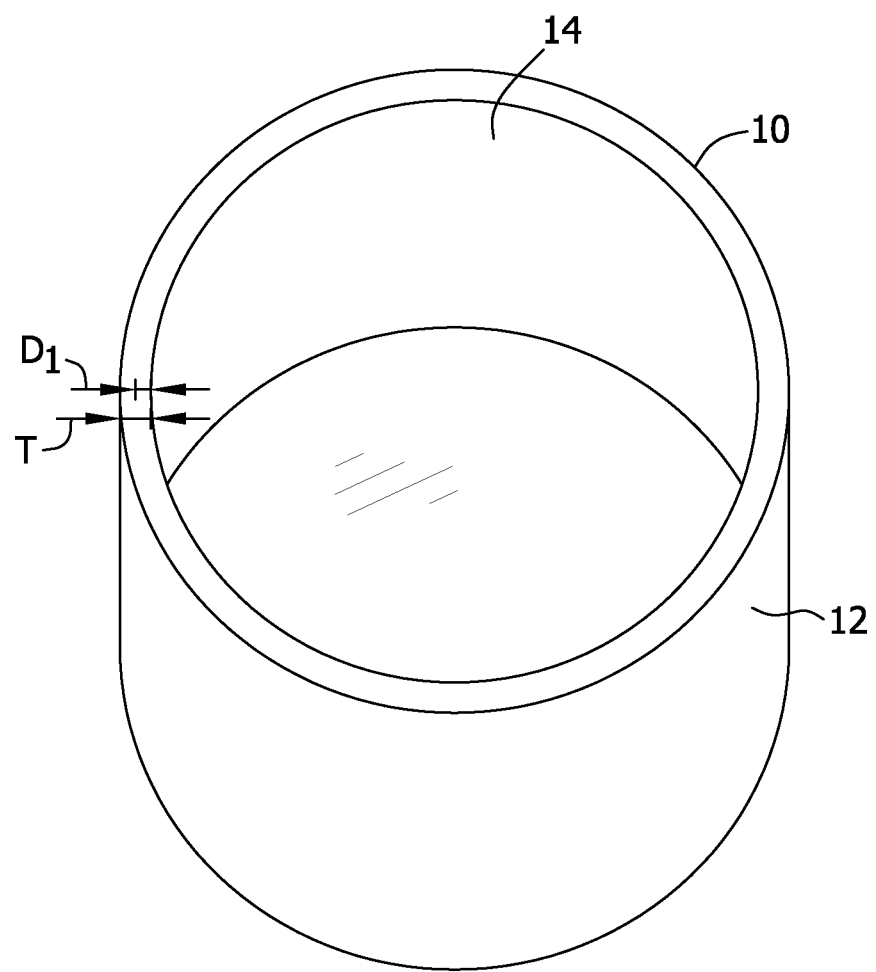

US 8,524,319 B2

METHODS FOR PRODUCING CRUCIBLES WITH A REDUCED AMOUNT OF BUBBLES

FIELD OF THE DISCLOSURE

The field of the disclosure relates to methods for producing crucibles for holding molten material that contain a reduced amount of gas pockets, to crucibles produced from such methods and to ingots and wafers that are produced from such crucibles. In some embodiments, the methods involve use of molten silica that may be outgassed prior to or during formation of the crucible.

BACKGROUND

Single crystal wafers (e.g., silicon single crystal wafers) are used as a substrate upon which electronic devices (e.g., integrated circuits) are built. Single crystal wafers may be produced by slicing the wafers from a single crystal ingot and subjecting the sliced wafers to various finishing operations such as various lapping, grinding, etching, and polishing steps to produce the finished wafers. Such ingots may be grown by the Czochralski method in which polycrystalline silicon is first melted within a quartz crucible. After the polycrystalline silicon has melted and the temperature equilibrated, a seed crystal is dipped into the melt and subsequently extracted to form a single crystal silicon ingot while the quartz crucible is rotated.

Device manufacturers increasingly require wafers that do not contain gas pockets at the surface of the wafer upon which devices are built. Such gas pockets in the wafer result from gas bubbles in the silicon melt being incorporated into the growing ingot during pulling of the silicon ingot. One source of such bubbles is gas pockets (i.e., bubbles) within the quartz crucible. Molten silicon slowly etches the quartz crucible which allows the gas therein to exit the crucible and enter the silicon melt. Some gases (e.g., oxygen) can dissolve into the melt before incorporation into the ingot. However, some less soluble gases (e.g., argon which is typically used as an insulating gas in the crystal pull chamber) dissolve at a slower rate and the gas bubble becomes incorporated into the silicon ingot thereby forming a gas pocket in the ingot.

A continuing need exits for silicon ingots and wafers with reduced gas pockets as well as crucibles that result in less gas bubbles being incorporated into the silicon ingot during ingot growth. A continuing need also exists for methods for producing crucibles that allow ingots and wafers with less gas bubbles to be produced.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a process for producing a crucible for holding molten material. The crucible has a base and one or more sidewalls. The process includes contacting a silicon and oxygen-containing gas with a crucible-shaped substrate having a base and one or more sidewalls to deposit silica onto the substrate. Deposited silica continuously grows to form a surface layer of silica of at least about 1 mm.

Another aspect of the present disclosure is directed to a process for producing a crucible for holding molten material. The crucible comprises silica and has a base and one or more sidewalls. The process includes shaping a plate or tube into the form of a crucible having a base and one or more sidewalls. The plate or tube comprises silica. The plate or tube has less than about 70 bubbles with a diameter of at least about 14 μm per cm$^3$.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

FIG. 1 is a perspective view of a crucible with a surface layer.

DETAILED DESCRIPTION

In various embodiments of the present disclosure, a crucible that is substantially free of bubbles may be formed by melting a source of silica and by outgassing gases from the molten silica prior to or during molding of the silica composition into a silica crucible. In other embodiments, a crucible is formed by contacting a crucible substrate (e.g., fused silica) with a gas that contains gaseous silicon and oxygen and depositing silica onto the surface of the crucible to form a surface layer on the crucible that is substantially free of bubbles.

It should be noted that, as used herein, "molten" silica and/or a silica "melt" refer to silica that has been heated to a point at which the silica can be molded to take the shape of an object (i.e., may be referred to as being "plastic") such as by use of force (e.g., by use of a paddle) and these terms are not intended to require a particular degree of silica flowability. Additionally, the term "melting" is intended to refer to a process in which silica is heated to a temperature at which silica may be molded to take the shape of an object and is not intended to imply that the material be present in a fully "liquid" state. Further, it should be noted that the terms "silica" and "quartz" as used herein are synonymous and refer to material composed of silica, i.e., SiO$_2$, and the term "quartz" should not be limited to quartz mineral. Further, the phrases "gas pockets" and "gas bubbles" which may be used in reference to the morphology of the crucible or of silicon ingots or wafers produced when using a crucible of the present disclosure refer to any detectable void in the material and are intended to be synonymous.

To prepare crucibles, a source of silica is melted to produce a molten composition. Generally any source of silica available to those of skill in the art may be used such as quartz sand, quartz powder, reclaimed glass or cullet. The source of silica may include at least about 10 wt % silica therein and, in other embodiments, contains at least about 25 wt %, at least about 50 wt %, at least about 75 wt %, at least about 85 wt %, at least about 95 wt %, at least about 99 wt %, from about 10 wt % to about 100 wt %, from about 50 wt % to about 100 wt %, from about 85 wt % to about 100 wt % or from about 95 wt % to about 100 wt % silica. In some embodiments, the source of silica consists essentially of silica (i.e., the source contains only silica and minor amounts of impurities). The source of silica may include fining agents (e.g., arsenic oxides, antimony oxides, $KNO_3$, $NaNO_3$, NaCl, fluorides or sulfates) to prevent bubble formation. Such fining agents may be present in the source of silica in an amount less than about 3 wt % or less than about 1 wt %.

The source of silica may contain relatively low amounts of impurities that can become incorporated into the silicon melt and the growing silicon ingot. High purity silica can be obtained commercially, for example, high purity ingots or tubing that is produced under the brand GE Type 214 (Momentive (Columbus, Ohio)). Such tubing may be melted or molded directly into the form of a crucible as described further below. Typical amount of impurities in GE Type 214 quartz is shown in Table 1 below.

TABLE 1

Purity amounts for commercial sources of high purity silica.

| Element | Amount (ppm) |
| --- | --- |
| Al | 14 |
| As | <0.002 |
| B | <0.2 |
| Ca | 0.4 |
| Cd | <0.01 |
| Cr | <0.05 |
| Cu | <0.05 |
| Fe | 0.2 |
| K | 0.6 |
| Li | 0.6 |
| Mg | 0.1 |
| Mn | <0.05 |
| Na | 0.7 |
| Ni | <0.1 |
| P | <0.2 |
| Sb | <0.003 |
| Ti | 1.1 |
| Zr | 0.8 |
| —OH (hydroxyl) | <5 |

It should be noted that the purity amounts shown in Table 1 are exemplary and the source of silica and/or the resulting crucible can have lower or higher amounts of the listed impurities without departing from the scope of the present disclosure.

The source of quartz may be melted by any method available to those of skill in the art and, in some embodiments, electric heaters or plasma torches may be used to melt the source of silica and/or to maintain the silica in a molten state. Generally the source of quartz is heated to a temperature above its softening point (i.e., the point at which quartz deforms under its own weight and has a viscosity of about 107.6 poise) which may range from about 1500° C. to about 1700° C. and is about 1683° C. for high purity quartz (e.g., GE Type 214). Most sources of silica (e.g., sources that contain mostly silica such as about 50 wt % to about 100 wt % or 95 wt % to about 100 wt % silica) are sufficiently moldable and/or flowable at a temperature of 1700° C. or more. In some embodiments, silica is heated to higher temperatures to promote flow such as at least about 1800° C., at least about 1900° C., at least about 2000° C. or more. Silica may be melted while being exposed to argon, nitrogen or air.

Suitable vessels which may be used to hold the silica during or after melting may be made of any material that can withstand high temperatures and which does not cause undesirable impurities to enter the silica melt. Exemplary vessels may be composed of graphite or graphite coated with SiC or that are made of molybdenum or tungsten including molybdenum or tungsten alloys.

Once melted, the molten silica composition may be molded into the shape of a crucible. To mold the composition, the composition typically is discharged from the vessel in which it is held onto a mold or a mandrel used to shape the composition into a crucible. In some embodiments, a molten bead of silica may be expelled from the vessel (which may be cone-shaped to promote discharge of molten silica) and the bead is poured into a mold or onto a mandrel.

In some embodiments, the molten composition is poured into a mold. Generally the mold has a void formed therein that has a shape and dimensions that correspond to the shape and dimensions of the desired crucible. Alternatively, the composition may be poured onto a mandrel and formed into a crucible. Typically the mandrel has a shape that corresponds to the inner cavity of the crucible and is arranged such that the portion of the mandrel that corresponds to the base of the crucible is positioned upward. The molten silica composition may be poured onto this portion of the mandrel to form the base of the crucible and allowed to pour down the side of the mandrel to form the sidewalls of the crucible. In some embodiments, force is applied to the molten composition to force it to conform it to the shape of the mandrel (e.g., by pushing or pressing a paddle against the composition while the composition is still at a moldable temperature).

By heating the composition above its softening point and allowing the crucible to be molded while in a plastic state, the silica melt is outgassed thereby reducing the amount of bubbles that may form during solidification of the crucible which results in formation of a clear-wall crucible. This is in contrast to vitreous fused silica crucibles which are quickly heated and cooled which results in bubbles being frozen into the crucible causing the crucible to be opaque.

After the crucible is formed, the crucible may be maintained above a temperature of about 1285° C. to anneal the crucible and to allow stresses in the crucible to be reduced which decreases the likelihood of cracking during cooling or future use. In other embodiments, the crucible is annealed at a temperature of at least about 1400° C., at least about 1500° C., at least about 1600° C. or from about 1285° C. to about 1683° C., from about 1285° C. to about 1600° C. or from about 1400° C. to about 1600° C. The temperature of the anneal should be less than the temperature at which the material begins to deform to prevent the crucible from losing its shape. In this regard, this temperature may vary depending on the purity of the source of silica with higher purity materials deforming at higher temperatures and vice versa. The anneal may be performed for about 60 minutes or longer (e.g., about 1 to about 4 hours) to allow for stresses to be relieved in the crucible.

The anneal may be performed after the crucible is formed and has undergone partial cooling (e.g., cooling to the anneal temperature) to solidify the crucible. Alternatively, the crucible may be cooled to below the anneal temperature and then heated back up to the anneal temperature.

In some embodiments, a vacuum is applied during melting, molding or the anneal processes to promote outgassing and reduction of bubbles in the crucible. It should be noted that outgassing also occurs at ambient pressures and in some embodiments of the present disclosure a vacuum is not applied during the melting, molding or anneal of the crucible.

After the molten composition is shaped into a crucible and after the optional anneal, the shaped composition is cooled to room temperature. In some embodiments, the shaped composition is cooled relatively slowly to allow stresses in the cooling crucible to be gradually relieved, which lessens the likelihood of the crucible cracking during cooling or during future use. In some embodiments of the present disclosure, at temperatures above the strain point of the silica material (i.e., the point at which the material relieves internal stress in about 4 hours or has a viscosity of about 1014.5 poise) the crucible is cooled (e.g., from the molding temperature or the anneal temperature) such that the instantaneous cooling rates during cooling are less than about 1° C./min. In other embodiments the instantaneous cooling rates above the strain point is less than about 0.5° C./min, less than about 0.1° C./min, from about 0.05° C./min to about 1° C./min or from about 0.1° C./min to about 1° C./min. In this regard, the strain point of silica may occur between about 1000° C. to about 1200° C. and is about 1120° C. for high purity silica (e.g., GE Type 214 quartz).

In this regard, the particular dimensions of the crucible may be chosen by those of skill in the art based on the particular use of the crucible (e.g., ingot diameter, crystal puller dimensions and the like). Generally most crucibles are cylindrical and have a base (which may be flat or curved) and a sidewall. Other arrangements may be used such as square or rectangular crucibles which have more than one sidewall without limitation. In embodiments wherein the crucible is used to hold molten silicon for growth of single crystal silicon ingots, the thickness of the crucible base and sidewalls may be at least about 6 mm or, as in other embodiments, at least about 8 mm, at least about 10 mm or even at least about 14 mm (e.g., from about 6 mm to about 40 mm, from about 6 mm to about 30 mm, from about 6 mm to about 20 mm or from about 10 mm to about 40 mm).

In some embodiments, rather than forming a crucible directly from the molten composition, the molten silica composition is molded to form a plate or tube under any of the same conditions described above for forming a crucible (e.g., outgassing, annealing and/or relatively low cooling rate). In embodiments wherein a plate is formed, the plate may be placed above a mandrel as previously described and shaped to form a crucible, optionally while heating the plate up to or above the softening point of silica. In embodiments wherein a tube is used, one of the two end portions of the tube is shaped to form the base of the crucible (e.g., by use of a chuck), typically while heating the end portion of the crucible which is shaped. The dimensions of the plate or tube should be chosen based on the desired dimensions of the crucible. In this regard, the plate or tube wall generally has a thickness that corresponds to the desired wall thickness of the crucible.

Generally, the crucible that forms after cooling is a clear-wall crucible rather than an opaque crucible as with crucibles formed from vitreous fused silica. The transparency results from a reduced amount of bubbles in the crucible as described further below.

In this regard, the crucible, plate or tube that is formed from the molten composition (and the crucibles that result after shaping of the plate or tube) have a relatively low concentration of bubbles and/or have a reduced size of bubbles. In several embodiments of the present disclosure, the crucible, plate or tube has less than about 70 bubbles with a diameter greater than about 14 μm per $cm^3$ or less than about 50, less than about 30, less than about 10 or even no bubbles with a diameter greater than about 14 μm per $cm^3$. In some embodiments, the crucible is substantially free of gas bubbles of a size greater than about 14 μm. For purposes of the present disclosure, the crucible is "substantially free" of gas bubbles when the crucible contains less than about 1 bubble with a diameter greater than about 14 μm per $cm^3$. In some embodiments, at least about 75% of the bubbles in the crucible have a nominal diameter of less than about 14 μm or at least about 85%, at least about 95% or at least about 99% of the bubbles in the crucible have a nominal diameter of less than about 14 μm.

In this regard, it should be understood that the number of bubbles may be determined by observing a portion of the crucible, e.g., by use of an optical microscope, and that the amount of bubbles described herein refers to such a method of observation unless stated otherwise. Further, in some embodiments, two or more portions of the crucible may be observed to determine if the threshold amount of bubbles is achieved. For instance, the number of bubbles per $cm^3$ may be determined for several coupons or optical views and the concentration of bubbles averaged over the number of views. The portions of the crucible that are observed may be obtained by breaking the crucible into portions (i.e., "coupons").

In some embodiments, rather than using a molten composition to form the crucible, a gas containing silicon and oxygen is contacted with a crucible-shaped substrate. Upon contacting the substrate, silica deposits on the substrate and continuously grows to form a surface layer of silica on the substrate. The silicon gas may be formed by oxidizing a silicon-containing liquid or gas (e.g., silane or a halosilane such as $SiF_4$ or $SiCl_4$ or tetraethoxysilane) such as by use of a hydrogen-oxygen flame. In some embodiments, a silicon dust may form from the gaseous phase and the silicon may be oxidized and sintered to form the clear-wall crucible.

While not limited to a particular thickness, in some embodiments the surface layer of silica that is produced has a thickness of at least about 1 mm or, as in other embodiments, at least about 2 mm, at least about 4 mm, from about 1 mm to about 7 mm, from about 1 mm to about 4 mm or from about 2 mm to about 5 mm. In this regard, silica may be formed on only a portion of the crucible (i.e., on the inner surface of the crucible that contacts the molten material during use) and the other portions of the crucible can be masked or otherwise made from contacting the gas stream.

The substrate upon which the layer of silica is deposited may be made of any suitable material for high temperature operations such as, for example, graphite or graphite coated with SiC or fused vitreous silica (i.e., silica that is prepared by conventional methods such as by melting sand in a mold while under relatively high vacuum). In some embodiments the substrate comprises at least about 10 wt % silica or at least about 25 wt %, at least about 50 wt %, at least about 75 wt %, at least about 85 wt %, at least about 95 wt %, at least about 99 wt % silica, from about 10 wt % to about 100 wt %, from about 50 wt % to about 100 wt %, from about 85 wt % to about 100 wt % or from about 95 wt % to about 100 wt % silica.

The silica surface layer may include at least about 95 wt % silica, at least about 99 wt % silica or even consists essentially of silica. The silica surface layer may contain less than about 70 bubbles per $cm^3$ or may contain less than about 50, less than about 30, less than about 10 or even no bubbles with a diameter greater than about 14 μm per $cm^3$. In some embodiments at least about 75% of the bubbles in the silica surface layer have a nominal diameter of less than about 14 μm or at least about 85%, at least about 95% or at least about 99% of the bubbles in the crucible have a nominal diameter of less than about 14 μm.

An exemplary crucible 10 prepared in accordance with the present disclosure (whether by a molding or a gas deposition process) is shown in FIG. 1. The crucible 10 has an outer surface 12 and an inner surface 14 for contacting the molten material. The crucible 10 has an average wall thickness T. A surface layer extends from the inner surface 14 to a depth D1. The surface layer contains less than about 70 bubbles per $cm^3$ or less than about 50, less than about 30 or even less than about 10 bubbles per cm$^3$ or even is substantially free of bubbles with a diameter greater than about 14 μm per cm$^3$ as explained above. In some embodiments, at least about 75% of the bubbles in the surface layer have a nominal diameter of less than about 14 μm or at least about 85%, at least about 95% or at least about 99% of the bubbles in the crucible have a nominal diameter of less than about 14 μm. In embodiments wherein the crucible is prepared by melting a source of silicon and molding the molten composition to produce the crucible, the surface layer extends from the inner surface 14 to the outer surface 12. In embodiments wherein a silica layer is produced by chemical vapor deposition, D1 may be at least about 1 mm or, as in other embodiments, at least about 2 mm, at least about 4 mm, from about 1 mm to about 7 mm, from about 1 mm to about 4 mm or from about 2 mm to about 5 mm. The silica surface layer may contain at least about 10 wt % silica or at least about 25 wt % silica, at least about 50 wt %, at least about 75 wt %, at least about 85 wt %, at least about 95 wt %, at least about 99 wt % silica, from about 10 wt % to about 100 wt %, from about 50 wt % to about 100 wt %, from about 85 wt % to about 100 wt % or from about 95 wt % to about 100 wt % silica. The remainder of the crucible may contain the same amount of silica (such as when pouring/molding is used and there is not a distinctly different surface layer) or may be made of other materials such as graphite or SiC.

By using a crucible with a reduced amount of bubbles, less gas pockets are incorporated into the ingot during crystal growth and into the resulting wafers. It should be noted that while the crucible of the present disclosure may be used to produce single crystal silicon ingots by the so-called Czochralski method in which a seed crystal is contacted with molten silicon and withdrawn to pull a silicon ingot, the crucible may be used for other purposes such as direct solidification (DS) processes or for production of materials other than silicon ingots.

Single crystal silicon wafers sliced from single crystal ingots prepared by use of a crucible of the present disclosure are less likely to have gas pockets which results in a reduced rejection rate of the wafers. In certain embodiments, in a population of wafers sliced from ingots produced by use of the crucible, less than about 6% (e.g., less than about 5% or from about 4% to about 6%) have a gas pocket with a diameter of about 100 μm or less in the front surface of the wafer. Alternatively or in addition, less than about 5.5% (e.g., less than about 5%, less than about 4.5%, from about 3.5% to about 5.5% or from about 3.5% to about 5%) of wafers in the population have a gas pocket with a diameter of about 50 μm or less in the front surface of the wafer. Alternatively or in addition, less than about 1.5% (e.g., less than about 1.3%, from about 0.75% to about 1.5%, from about 1% to about 1.5% or from about 1% to about 1.3%) of wafers in the population have a gas pocket with a diameter of about 30 μm or less in the front surface of the layer. The population of wafers may include at least about 25 wafers, at least about 50 wafers, at least about 100 wafers, at least about 500 wafers or even about 1000 wafers or more. The likelihood of gas pockets in such wafers relative to wafers produced by use of conventional crucibles is described in Example 2 below. The wafers of the population may be in a pre-processed state such as before polishing, lapping or other flatness or surface roughness processing. For example, each wafer in the population may have saw marks and/or a surface roughness of at least about 2 Å as measured with scan sizes of about 1 μm×about 1 μm to about 100 μm×about 100 μm.

Gas pockets in the wafers may be determined by use of an IR camera and SP1 or SP2 inspection tools. In this regard, it should be noted that the size of gas pockets in the distribution profiles described above may be greater than about 30 μm (e.g., about 100 μm to about 30 μm, from about 50 μm to about 30 μm or at about 30 μm) as 30 μm is near the current detection limit of air pockets for SP1 and SP2 inspection tools.

The silicon ingot from which the wafers are sliced typically has a concentration of gas pockets less than the amount of gas pockets in ingots produced from vitreous silica crucibles. As the amount of gas pockets can vary radially and/or axially in the ingot, the ingot may be characterized by the amount of gas pockets formed in wafers subsequently sliced from the ingot. For instance, when the constant diameter portion of the ingot is sliced into wafers by a wire saw, less than about 6% (e.g., less than about 5% or from about 4% to about 6%) of the sliced wafers have a gas pocket with a diameter of about 100 μm or less. Alternatively or in addition, the ingot may have a concentration of gas pockets such that, upon subsequently slicing the constant diameter portion into wafers, less than about 5.5% (e.g., less than about 5%, less than about 4.5%, from about 3.5% to about 5.5% or from about 3.5% to about 5%) of the sliced wafers have a gas pocket with a diameter of about 50 μm or less. Alternatively or in addition, the ingot has a concentration of gas pockets such that, upon subsequently slicing the constant diameter portion into wafers, less than about 1.5% (e.g., less than about 1.3%, from about 0.75% to about 1.5%, from about 1% to about 1.5% or from about 1% to about 1.3%) of the sliced wafers have a gas pocket with a diameter of about 30 μm or less.

EXAMPLES

The processes of the present disclosure are further illustrated by the following Examples. These Examples should not be viewed in a limiting sense.

Example 1

Production of a Crucible by Tube Forming

GE 214 clear wall quartz tubing was used to form a clear-wall crucible with a reduced amount of bubbles. The tubing was cut to length and one end of the tubing was molded to form the base of the crucible by heating and use of a chuck. The tubing and resulting crucible had a diameter of about 32 inches (81 cm). The crucible was suitable for use in growing a single crystal silicon ingot.

Example 2

Modeling the Likelihood that Gas Pockets are Produced in Wafers Sliced from Ingots by Use of a Crucible Substantially Free of Bubbles Modeling was performed to determine the likelihood that gas pockets would form in wafers produced in conventional vitreous fused quartz crucibles and in clear-wall crucibles that are substantially free of bubbles (i.e., less than about 1 bubble of a size of 14 μm or more per cm$^3$). The prevalence of gas pockets that form in the resulting wafers as determined by modeling is shown in Table 2 below.

TABLE 2

Likelihood of Gas Pocket Formation in Wafers Sliced from Ingots Grown from Vitreous Fused Quartz and Clear-Wall Fused Quartz Crucibles

|  | Vitreous Fused Quartz Crucible | Clear-Wall Fused Quartz Crucible |
|---|---|---|
| Incidence of gas pockets with diameter less than about 30 um | 1.65% of wafers | 1.21% of wafers |
| Incidence of gas pockets with diameter less than about 50 um | 5.80% of wafers | 3.91% of wafers |
| Incidence of gas pockets with diameter less than about 100 um | 6.42% of wafers | 4.25% of wafers |

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A process for producing a crucible for holding molten material, the crucible having a base and one or more sidewalls, the process comprising contacting a silicon and oxygen-containing gas with a crucible-shaped substrate having a base and one or more sidewalls to deposit silica onto the substrate, deposited silica continuously growing to form a surface layer of silica of at least about 1 mm.

2. The process as set forth in claim 1 wherein silica continuously grows to form a surface layer of silica of at least about 2 mm.

3. The process as set forth in claim 1 wherein the silicon and oxygen-containing gas is produced by oxidizing a silicon-containing gas or liquid.

4. The process as set forth in claim 3 wherein the silicon-containing gas or liquid used to produce the silicon and oxygen-containing gas is selected from the group consisting of silane, halosilane and tetraethoxysilane.

5. The process as set forth in claim 1 wherein the surface layer comprises at least about 95 wt % silica.

6. The process as set forth in claim 1 wherein the substrate comprises at least about 10 wt % silica.

7. The process as set forth in claim 1 wherein the silica surface layer has less than about 70 bubbles with a diameter of at least about 14 μm per cm$^3$.

8. The process as set forth in claim 1 wherein the crucible is substantially free of bubbles with a diameter of at least about 14 μm.

9. The process as set forth in claim 1 wherein at least about 75% of the bubbles in the silica surface layer have a nominal diameter of less than about 14 μm.

10. The process as set forth in claim 1 wherein the substrate is composed of fused silica.

11. A process for producing a crucible for holding molten material, the crucible comprising silica and having a base and one or more sidewalls, the process comprising shaping a plate or tube into the form of a crucible having a base and one or more sidewalls, the plate or tube comprising silica, the plate or tube having less than about 70 bubbles with a diameter of at least about 14 μm per cm$^3$.

12. The process as set forth in claim 11 wherein the silica surface layer contains less than about 50 bubbles with a diameter of at least about 14 μm per cm$^3$.

13. The process as set forth in claim 11 wherein the silica surface layer is substantially free of bubbles with a diameter of at least about 14 μm.

14. The process as set forth in claim 11 wherein the plate or tube is shaped into the form of a crucible while heating the plate or tube.

15. The process as set forth in claim 11 wherein the tube has an end portion that is shaped to form the base of the crucible.

16. The process as set forth in claim 11 wherein the plate or tube comprises at least about 10 wt % silica.

17. The process as set forth in claim 11 wherein the crucible has a thickness of at least about 6 mm.

18. The process as set forth in claim 1 wherein silica continuously grows to form a surface layer of silica of at least about 4 mm.

19. The process as set forth in claim 1 wherein the silica surface layer has less than about 10 bubbles with a diameter of at least about 14 μm per cm$^3$.

20. The process as set forth in claim 11 wherein the plate or tube comprises at least about 95 wt % silica.

\* \* \* \* \*